United States Patent [19]

Nagata et al.

[11] 3,992,208
[45] Nov. 16, 1976

[54] PHOTO-SENSITIVE ETCHANT AND METHOD FOR FORMING METAL IMAGE USING SAME

[75] Inventors: Masayoshi Nagata; Gyoji Suzuki; Takeshi Tomotsu, all of Asaka, Japan

[73] Assignee: Fuji Photo Film Co., Ltd., Minami-ashigara, Japan

[22] Filed: Mar. 12, 1974

[21] Appl. No.: 450,514

[30] Foreign Application Priority Data

Mar. 12, 1973  Japan.............................. 48-28708
Apr. 2, 1973   Japan.............................. 48-37961

[52] U.S. Cl.................................. 96/36; 96/88; 156/4; 156/18; 252/79.1; 252/79.3
[51] Int. Cl.$^2$.................................. G03C 5/00
[58] Field of Search............... 96/88, 36; 156/4, 18; 252/79.1, 79.3

[56] References Cited
UNITED STATES PATENTS

| | | | |
|---|---|---|---|
| 3,494,768 | 2/1970 | Schaefer | 156/4 |
| 3,520,684 | 7/1970 | Metlay et al. | 96/36 |
| 3,520,685 | 7/1970 | Schaefer | 96/36 |
| 3,520,686 | 7/1970 | Kopczewski et al. | 96/36 |
| 3,520,687 | 7/1970 | Schaefer | 96/36 |
| 3,529,963 | 9/1970 | Marchese | 96/114.1 |
| 3,935,117 | 1/1976 | Suzuki et al. | 96/88 |

Primary Examiner—David Klein
Assistant Examiner—Judson R. Hightower
Attorney, Agent, or Firm—Sughrue, Rothwell, Mion, Zinn and Macpeak

[57] ABSTRACT

A photo-sensitive etchant comprising (1) a first composition comprising a substance capable of producing water upon exposure to light, a binder and a solvent and (2) a second composition comprising a compound capable of producing, upon exposure to light, a metal-etching substance or a substance which reacts with another other substance to form a metal-etching product, a binder and a solvent; and a method for forming metal image by using the photosensitive etchant.

15 Claims, No Drawings

PHOTO-SENSITIVE ETCHANT AND METHOD FOR FORMING METAL IMAGE USING SAME

BACKGROUND OF THE INVENTION

1. Field of the Invention

The present invention relates to a photo-sensitive etchant and a method for forming metal image using the same.

The term "metal images" as used herein in the present specification means metal images in which image areas or non-image areas form depressions or projections and can be visually distinguished from each other, or means images comprising at least in part metal in which image areas or non-image areas can be visually or physically distinguished from each other by the difference in the material, and/or the physical property.

2. Description of the Prior Art

Metal images have so far been utilized in various fields. In general, metal images are formed by a photo-etching method. For example, they are formed by providing a film of a light-sensitive substance such as a photosensitive polymer on a plate or film of a metal such as aluminum, subjecting the plate or film of the metal having the light-sensitive substance thereon to image-exposure to harden the exposed areas of the light-sensitive film, washing away the non-hardened unexposed areas with an organic solvent, etching (or engraving) the uncovered areas (where the metal surface is exposed) with an etchant or bringing the areas into contact with a solution containing an ingredient capable of reacting with the metal to thereby change the surface properties (i.e., to convert the metal in the surface portion to another substance by reaction with this ingredient), and then removing the hardened film covering the light exposed areas.

However, in the above-described method for forming metal images by a photoetching method, even the hardened film is also weakened in practice upon removing the film in the non-hardened areas to such an extent that in some cases the hardened film is also removed. Therefore, where extremely fine hardened areas exist, i.e., in order to obtain metal images having fine areas, extremely skilled techniques are required.

Heretofore, as an improved photoetching method, photosensitive etching solutions and methods which enable both exposure and etching to be conducted at the same time, as disclosed in U.S. Pat. Nos. 3,095,332, 3,346,384, 3,482,975, 3,482,976, 3,494,768, etc., have been suggested. However, in these methods, since a liquid or gaseous photo-sensitive etchant is continuously supplied between a photomask and a metal film, it is difficult to conduct the reaction of the fluid state light-decomposition product with the metal film uniformly all over the film in a short period of time. In addition, it is impossible to enhance the accuracy of the images. Furthermore, in the case of forming a liquid photosensitive etchant layer, the surface tension between this layer and the metal film, the adhesion property and the like must be taken into consideration. Thus, the method, such as the method for coating the liquid photo-sensitive etchant, the coating apparatus, the exposing method, the exposing apparatus, etc. are complicated. In addition, a defect in that the liquid layer disturbs the light path results.

On the other hand, the etching of a metal film using a solid photo-sensitive etching layer comprising iodoform, polystyrene and benzene has also been suggested. However, in fact, the rate of this etching reaction is so slow that some metals are barely changed.

As a result of extensive investigations to remove the above-described defects with the conventional metal image-forming methods, the inventors have achieved the present invention.

That is, a primary object of the present invention is to provide a light-sensitive etching agent which can etch metal accurately and rapidly.

A second object of this invention is to provide a method of forming an image by using the light-sensitive etching agent of this invention.

SUMMARY OF THE INVENTION

Accordingly the present invention provides a photo-sensitive etchant comprising two compositions: a first composition comprising a compound capable of being decomposed upon exposure to light to form a substance which per se etches a metal film or which reacts with another substance to form a reaction product capable of etching a metal film, a binder and a solvent; and a second composition comprising a substance capable of forming water upon exposure to light, a binder and a solvent; and a method for forming metal images involving the steps of coating the photo-sensitive etchant on the surface of the metal as one layer containing a mixture of all of the ingredients or as two layers containing, respectively, the first composition and the second composition, drying the coated metal film, and imagewise exposing the thus formed layer or layers.

DETAILED DESCRIPTION OF THE INVENTION

A very important characteristic in the present invention is to use a solid state photo-sensitive etchant containing a substance capable of producing water upon exposure to light. That is, the photo-sensitive etchant layer provided on a metal film is entirely in a solid state before exposure but, after exposure, the exposed areas change to a fluid state due to the water produced at the exposed areas only. On the other hand, the photo-decomposable compound present in the solid photo-sensitive etchant layer forms an etching substance upon exposure, this compound producing a substance which upon exposure, etches the metal film or reacts with another substance to form a reaction product capable of etching the metal film (hereinafter this compound is referred to as a compound capable of forming an etching substance upon exposure to light), and this substance moves only through the exposed areas due to the presence of aforesaid water. In other words, the method of the present invention is characterized in that a photo-sensitive etchant layer is provided on a metal film and metal images are formed by image-exposure, the etchant layer having the property that it is in a solid state before exposure and only the light-struck areas changes to a fluid state upon exposure. Thus, water can be produced in a uniform amount in the depth direction of the photo-sensitive etchant layer in proportion to the exposure amount, which provides the ability to etch the metal rapidly with good accuracy.

Illustrative of substances which can be used in the present invention to form water upon exposure to light are a combination of N,N-dimethylinitroaniline and benzyl cyanide; a combination of an alcohol (including a polyhydric alcohol) and aniline hydrobromide; nitromethane; methyl nitrite; quinine derivatives such as quinine, quinine hydrochloride, quinine hydrobromide, and quinine bisulphite; carboxylic acid hydrates such as oxalic acid, flavianic acid, tetrachloronaphthalene dicarboxylic acid hydrate and hydroxypyruvic acid hydrate; sulfonic acid hydrates such as sulfobenzoic acid and nitronaphthalene sulfonic acid dihydrate; nitrogen compound hydrates such as piperazine, 4,4'-dipyridyl and hydrazine hydrate; and aldehyde hydrates such as chloral hydrate and bromal hydrate; and the like.

On the other hand, examples of compounds capable of forming an etching substance upon exposure to light are, e.g., the following:

1. compounds containing an iminosulfadifluoride group ($-N=SF_2$), such as phenyliminosulfadifluoride, $\alpha$, $\alpha$-difluorobenzyliminosulfadifluoride, 1,1,2,2-tetrafluoroethane-1,2-bis(iminosulfadifluoride), propyliminosulfadifluoride, tetrahydrofuran-3,4-bis-(iminosulfadifluoride), etc., 2. compounds containing a sulfapentafluoride group ($-SF_5$) and their derivatives, such as phenylsulfapentafluoride, nitrophenylsulfapentafluoride, aminophenylsulfapentafluoride hydrobromide, aminophenylsulfapentafluoride, azidophenylsulfapentafluoride, phenyl-bis(sulfapentafluoride), naphtholazophenylsulfapentafluoride, aminophenyl-bis(sulfapentafluoride) hydrobromide, bis-(sulfapentafluoride)azobenzene, diperfluoroethylsulfatetrafluoride, perfluorothioxane tetrafluoride, phenylsulfachloride tetrafluoride, n-butylsulfachloride tetrafluoride, 1-chloroethane-1,2-bis-(sulfapentafluoride), [(di-chloroethanediylidene)-dinitrilo]-bis-sulfapentafluoride), pentafluorosulfaoxybenzene, 3-pentafluorosulfapyrazole, perfluorotetradecane-1,14-bis(pentafluorosulfoxide), etc., and derivatives thereof.

3. compounds containing a sulfonylfluoride group ($-SO_2F$), such as benzenesulfonyl fluoride, sulfanilylfluoride, isocyanatobenzenesulfonyl fluoride, methylsulfonyl fluoride, perfluorohexane-1,6-bis(sulfonyl fluoride), fluorosulfonylbenzene-sulfonly chloride, etc., 4. polyhalogenated benzenes and their derivatives having the general formula

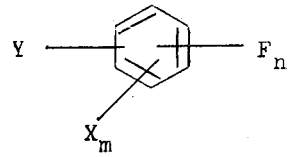

wherein X and Y, which may be the same or different, are a hydrogen atom, a halogen atom, an alkyl group or an aryl group, and $m$ and $n$ are integers (if $m = n$, $n \neq 0$), such as 1,2-dibromotetrafluorobenzene, pentafluoroiodobenzene, fluorobenzene, hexafluorobenzene, p,p'-difluorodiphenylsulfone, etc., 5. perfluorobiphenyls and their derivatives having the general formula

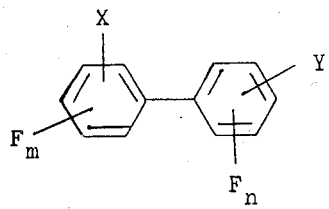

wherein X and Y, which may be the same or different, are a hydrogen atom, a mercapto group, a sulfonic group, a hydroxyl group or a halogen atom, and $m$ and $n$ are integers (where if $m = n$, $n \neq 0$), such as perfluorobiphenyl, 4,4'-dimercaptoperfluorobiphenyl, etc., 6. $\alpha,\alpha,\alpha$-trifluorotoluene and derivatives thereof having the general formula

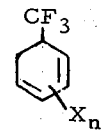

wherein X in the above general formula is a hydrogen atom, a hydroxyl group, a carboxyl group, an acetyl group, a nitro group or a halogen atom, and $n$ is an integer, such as $\alpha,\alpha,\alpha$-trifluorotoluene, m-bromo-$\alpha,\alpha,\alpha$-trifluorotoluene, nitro-$\alpha,\alpha,\alpha$-trifluorotoluene, 3,5-di-(trifluoromethyl)phenol, $\alpha,\alpha,\alpha$-trifluorocresol, trifluoromethylbenzoic acid, methyl trifluoromethylbenzoate, etc., 7. trifluoromethylnaphthol and derivatives thereof having the general formula

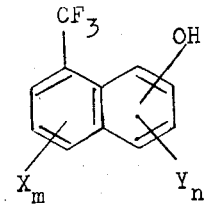

wherein X and Y, which may be the same or different, each is a hydrogen atom, a hydroxyl group or a sulfonic group, and $m$ and $n$ are integers (if $m = n$, $n \neq 0$) such as trifluoromethylnaphthol, trifluoromethyl naphthol sulfonic acid, and trifluoromethyl naphthol disulfonic acid, 8. fluorouracil, dimethylfluorouracil, 5-trifluoromethyl-2,6-dihydroxypyrimidine, etc. and derivatives thereof, having the general formula

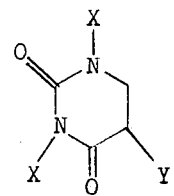

wherein X is a hydrogen atom or a methyl group, and Y is a fluorine atom or a trifluoro carbon group ($CF_3$), 9. copolymers of tetrafluoroethylene and perfluoronitrosoalkanes having therein repeating units of the formula

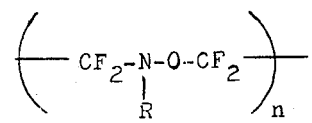

wherein R is an alkyl group such as methyl or ethyl, with the molecular weight of the polymer being about 7,000 to 10,000, such as perfluoro-nitrosomethane, perfluoronitrosoethane and perfluoronitroso n-propane, 10. compounds containing a ketone group and a fluorine atom, such as monofluoroacetone, 4,4'-fluorobenzophenone, fluoranyl, etc., 11. compounds containing a difluoramino group ($-NF_2$) and compounds converted from tetrafluorohydrazine

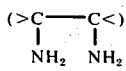

such as trityldifluoroamine, $\alpha,\beta$-bis(difluoramino)-perfluoropropylethyl ether, $\alpha$-difluoraminoperfluoropropionyl fluoride, $\alpha$-difluoraminofluorimine, 3-difluoramino-2-fluoro-2-aza-cyclohexanone, 1,1,2-tris-tris(difluoramino)-3,5-cyclohexadiene, tetrafluorohydrazine, etc., 12. perfluoro(alkylene-alkylamines) and their derivatives having the general formula

wherein X is a fluorine atom or a perfluoroalkyl group, and R is a perfluoroalkyl group, such as perfluoro(methylene-n-propylamine), perfluoro(methylene-n-butylamine), perfluoro(ethylene-n-butylamine), etc., 13. halogenated hydrocarbons (of the formula R—F, wherein R is a halogenated alkyl group), such as trifluoroiodomethane, difluorodichloropropane, difluorodibromopropane, tetrafluorodibromopropane, etc., 14. fluorinated alcohols (of the formula R—OH, wherein R is a fluorinated alkyl group) such as 1-fluoro-2-propanol, perfluoropentanol, perfluoro-tert-butylalcohol, perfluoropinacol, bis-(perfluoro-isopropyl)carbinol, etc., 15. fluorophosphoranes ($X_nPF_{5-n}$, where n is an integer) such as phenyltetrafluorophosphorane, diphenyltrifluorophosphorane, triphenyldifluorophosphorane, diethyltrifluorophosphorane, etc., and 16. phosphoryl fluoride derivatives ($-PO_2F_2$) such as difluorophosphoric acid anhydride, polyphosphoryl fluoride, etc.

The photo-sensitive etchant of the present invention is a mixture of at least one of the above-described substances, a binder and a solvent. That is, the first composition comprises at least three components, i.e., a substance capable of producing water upon irradiation with light, a binder (film-forming substance) and a solvent, and the second composition comprises at least three components, i.e., a compound which is decomposed by irradiation with light to form a substance capable of etching metal or capable of reacting with another substance to form a metal-etching product, a binder and a solvent. The etchant of the present invention is a combination of the above described first composition and the second composition. In both compositions, the binder and the solvent should not detrimentally influence the metal surface to which they are to be applied. However, since the metal film is usually a gold, silver, copper, iron, tin, lead, zinc, platinum, aluminum, nickel, chromium, tellurium, tungsten, molybdenum, titanium, tantalum, bismuth, silicon, or a like metal, metal alloys (e.g., brass), all kinds of binders and solvents can be used in practice.

As was described before, it is of importance in the photosensitive etchant of the invention that the compound capable of forming a metal film-etching substance upon exposure to light and the compound capable of producing water upon exposure to light are differently constituted. These two compositions require a binder and a solvent since they are coated onto a metal film in the form of multi-layers or a mono-layer upon use so as to form a solid coated layer or layers. Therefore, the binders and the solvents to be incorporated in both compositions can be the same or different from each other.

Examples of suitable binders and the solvents are illustrated below. As the binders, examples are natural high polymers such as gelatin and casein, synthetic high polymers such as polyvinyl resins (e.g., polyvinyl pyrrolidone, polyvinyl alcohol, polyvinyl acetate, polyvinyl butyral, etc.), polystyrene resins (e.g., poly-(2-fluorostyrene), poly(4-bromostyrene), etc.), polyacrylic acid resins (e.g., polymethyl acrylate, polyethyl acrylate, polymethacrylate, polymethyl methacrylate, etc.), styrene copolymer resins (e.g., styrene-vinyl pyrrolidone copolymer, styrene-maleic anhydride copolymer, etc.), low molecular weight formaldehyde resin, etc.

On the other hand, suitable solvents are aromatic hydrocarbons (e.g., benzene, toluene, xylene, etc.), aliphatic hydrocarbons (e.g., n-hexane, etc.), alicyclic hydrocarbons (e.g., cyclohexane, etc.), ketones (e.g., acetone, methyl ethyl ketone, etc.), alcohols (e.g., methyl alcohol, ethyl alcohol, n-butyl alcohol, etc.), ketoalcohols (e.g., diacetone alcohol, etc.), esters (e.g., methyl acetate, ethyl acetate, etc.), ethers (e.g., diethyl ether, ethyl propyl ether, tetrahydrofuran, etc.), petroleum ether, carbon disulfide, and the like. The solvents which can be employed are not particularly limited. However, those solvents which have a low boiling point (e.g., within the range of about 35° C to 90° C) are preferred since they permit drying with ease.

The proportions of the ingredients in each composition are not particularly limited, but it is preferable to incorporate the ingredients so that the amount of fluorine is not less than 0.05%, especially up to 5% by weight (on the assumption that the compound capable of forming an etching substance upon exposure to light is decomposed to an extent of 100%) and the amount of water is not less than 0.1%, especially up to about 1%, by weight (on the assumption that water is produced in 100% yield from the compound capable of producing water upon exposure to light). The amounts of the binder and the solvent can be appropriately selected by those skilled in the art. Generally, however, the amount of the binder to the amount of binder plus the solvent, ranges from about 10 to 60, preferably 15 to 50% by weight.

Each composition of the present invention requires the abovedescribed ingredients as the necessary components. However, it should be pointed out that the number of ingredients can be reduced when a compound performing multi-functions such as a copolymer of tetrafluoroethylene and perfluoronitroso alkane having a molecular weight of from about 10,000 to about 7,000; poly(pentafluorosulfo)styrene having a molecular weight of about 20,000, as an etchant generating material and a binder; and such as a polyhalogenated benzene (e.g., 1,2-dibromotetrafluorobenzene, pentafluoroiodobenzene, hexafluorobenzene, fluorobenzene, etc.); polyfluorotoluene derivatives (e.g., $\alpha,\alpha,\alpha$-trifluorotoluene, methabromo-$\alpha,\alpha,\alpha$-trifluorotoluene, $\alpha,\alpha,\alpha$-trifluorocresol; etc.); monofluoroacetone; fluoroalcohol (e.g., fluoropropanol, perfluoropentanol, etc.) as a material acting as an etchant generating material and a solvent; is used.

If desired, each composition can contain other ingredients. Illustrative of such additional ingredients are, for example, a photolysis-accelerator (e.g., halogenated benzenes such as bromobenzene, iodobenzene, p-nitroiodobenzene, etc., halogenated hydrocarbons containing a sulfonyl chloride group, such as trichloromethanesulfonyl chloride, trichloromethanesulfonyl chloride, etc., aldehydes such as formaldehyde, acetaldehyde, benzaldehyde, phenylacetaldehyde, etc., ketones such as acetophenone, benzophenone, 4,4'-bis(dimethylamino)benzophenone, bromoethyl methyl ketone, ω-bromoacetophenone, anthraquinone, xanthone, tert-butylanthraquinone, nitroanthraquinone, benzoin, etc., ethers such as benzoin ethyl ether, benzoin methyl ether, naphthyl methyl ether, thienofuran, phenoxazine, xanthene, chromene, etc.), an etching reaction-accelerator, and the like. The photo decomposition-accelerator can be selected with ease from those known compounds which become reactive upon exposure to light and are generally used in an amount of about 0.5 to 15% by weight, preferably 1 to 10% by weight. In some cases, these compounds accelerate the etching reaction and the oxidation reaction (to form, e.g., a passive substance on the metal film), as well as photolysis. The etching reaction-accelerator is in general an acidic substance, organic acid being particularly practical. Examples of suitable etching reaction-accelerators are carboxylic acids such as acetic acid, propionic acid, isobutyric acid, oxalic acid, malonic acid, succinic acid, dimethylmalonic acid or like carboxylic acids fluoroacetic acid, trifluoroacetic acid, dichloroacetic acid, α-fluoropropionic acid or like halogenated acids, sulfonic acids such as 1,2-ethanedisulfonic acid, trifluoromethanesulfonic acid, trichloromethanesulfonic acid, etc., paracids such as peracetic acid, perbenzoic acid, hydrogen peroxide, ammonium persulfate, etc., mineral acids such as hydrochloric acid, sulfuric acid, nitric acid, phosphoric acid, polyphosphoric acid, etc. A suitable amount of these etching reaction accelerators generally ranges from 0 to 20%, preferably 0 to 10%, by weight. Some substances which are etching reaction-accelerators (e.g., peracids) also possess properties for accelerating photolysis as well. Therefore, use of such substances is convenient. A light source having wavelength of from 300 to 500 mμ as used in the semi-conductor art is generally employed, using, for example, a high-pressure mercury lamp of 100 W for 3 minutes. The exposure times can of course be varied by one skilled in the art to achieve the objects of this invention.

The metal film is as described before. If desired, the metal film can be on an insulating support, such as a support of silicon oxide, silicon nitride, glass, plastic, etc. and provided on the support by vacuum deposition, lamination, sputtering, plating or a like method.

The photo-sensitive etchant is applied to the metal film in the dark using well known coating methods such as dip-coating, spinner-coating, etc. The coated film is then dried. Where the coating is a multi-layer coating, the order of coating the two compositions is not particularly limited. The thus obtained photo-sensitive etchant layer is imagewise irradiated through a photomask with light emitted from a mercury lamp, a xenon lamp or a tungsten lamp, with an electron beam, or with laser light. The photo-sensitive etchant at the irradiated areas is decomposed to produce both the etching substance and water. Thus, the decomposition product etches the metal film in the presence of water to remove the film at the irradiated areas. Since the amount of water is extremely small and the decomposition of the compound and the production of water proceed continuously, it is difficult to discern these changes with the naked eye.

As an example of the reaction product between the photodecomposition product and another substance which etches the above-described metal film, there is illustrated a photo-sensitive etchant comprising phenylsulfapentafluoride (as a fluoride compound), polystyrene (as a binder) and benzene (as a solvent). With this example, fluoride ions are released from phenylsulfapentafluoride upon exposure to light, these fluoride ions reacting with hydrogen ions from the polystyrene to form hydrogen fluoride. The resulting hydrogen fluoride etches the metal film. The unexposed photo-sensitive etchant and the reaction product between the decomposition product and the metal film can be removed using water, organic solvents, such as aromatic hydrocarbons (e.g., toluene, xylene, etc.); ketones (e.g., acetone, methyl ethyl ketone, etc.); ethers (e.g., tetrahydrofuran, dioxane, methylcellosolve, ethylcellosolve, etc.); alcohols (e.g., methanol, ethanol); a mixture thereof and mixtures thereof with water, etc.

Additionally, by selecting the thickness of the photo-sensitive etchant layer and exposure time only the metal film is etched. The thickness and the exposure time selected will differ depending upon the composition and the material to be etched. Where an iron film layer is employed as an example, 1 μm of the iron film layer can be etched upon an exposure for 60 to 90 sec. Appropriate exposure times and thicknesses can be easily selected by one skilled in the art.

As was described above, an electrode for semi-conductor element necessary and indispensable for integrated circuits, transistors, and the like can be formed rapidly in an extremely simple manner using the photo-sensitive etchant of the present invention. That is, while conventional methods have required 10 to 15 minutes to etch a metal film using a 300 W light source, the photo-sensitive etchant of the present invention enables a metal film of the same thickness to be etched in a period as short as about 1 minute using a 100 W light source.

In the case of completely etching the metal film as in the preparation of metal photomasks, printed circuit base plates or the like, or in the case of stopping the etching at a certain depth in (or at the surface of) the metal film as in the preparation of name plates, printing plates or the like, the photo-sensitive etchant can be prepared in a similar manner. Also, in the case of forming images by changing the color of light-irradiated areas or in the case of causing differences in affinity to printing inks between the exposed areas and the non-exposed areas for use as a printing plate as is different from the production of uneven-surfaced images by etching, the photo-sensitive etchant can be prepared in a similar manner. Furthermore, in preparing images for use as optical images, images having etched areas and non-etched areas greatly different from each other in optical density can be obtained without necessarily removing the photo-sensitive etchant located at the non-exposed areas and the reaction product between the decomposition product thereof and the metal film.

The photo-sensitive etchant of the present invention possesses the advantages that, since it is separated into two compositions, solvents and binders suitable as compounds in each of the compositions can appropriately be used (of course, the same solvents and binders being suitable), that in coating as mono-layer, since both compositions can be mixed with each other immediately before coating, less fog is formed as compared with mixing both compositions in advance, and that in the case of coating the compositions as multi-layers, the multi-layers can be formed immediately before use, and hence even when the compound capable of producing water upon exposure to light and the compound capable of producing an etching compound are unstable with respect to each other, they can satisfactorily be used (i.e., the ability to use a broader selection of both compounds).

The method of the present invention is extremely advantageous in that fine images can be obtained in an extremely short period of time in every case and that the number of steps involved is used.

The present invention will now be illustrated in greater detail by reference to the following non-limiting examples of preferred embodiments of the present invention. Unless otherwise indicated, all parts, percents, ratios and the like are by weight.

EXAMPLE 1

A photo-sensitive etchant comprising 6 g of $\alpha,\alpha,\alpha$-trifluorocresol (as a fluorine compound capable of producing an aluminum film-etching substance upon exposure to light), 6 g of polyvinyl butyral (molecular weight: about 10,000) as a binder, 0.6 g of benzoin ethyl ether as a photo-decomposition accelerator, 6 g of nitrosodimethylaniline and 4.7 g of benzyl cyanide as substances capable of producing water upon irradiation with light, and 10 g of acetone as a solvent was applied to a 0.5–1 mm-thick aluminum film surface provided on a plastic film or on a metal plate using dip-coating, followed by maintaining at 40° C for 15 minutes to thereby form a dry, film-shaped, photo-sensitive etchant layer of a thickness of 30 microns on the aluminum film. Then, it was exposed to a high pressure mercury lamp (100 W) through an image-bearing photomask intimately superposed thereon. Thus, depressions were formed on the areas of the aluminum film corresponding to the transparent image areas of the photomask in a period of time as short as 60 seconds, followed by processing with a 1:1 by volume mixture of methanol and acetone. Thus, the excess photo-sensitive etchant and the reaction product between the photo-sensitive etchant and aluminum were removed to prepare a name plate.

EXAMPLE 2

A photo-sensitive etchant comprising 3 g of pentafluoroiodobenzene as a fluorine compound, 3 g of polystyrene (molecular weight: about 20,000) as a binder, 3 g of acetone as a solvent, 1 g of p-nitroiodobenzene as a photo-decomposition accelerator, 0.2 g of 15% peracetic acid as an etching reaction-accelerator, and 3 g of nitromethane as a substance capable of producing water upon irradiation with light was prepared.

Separately, aluminum was vacuum deposited all over an Si—$SiO_2$ wafer of a diameter of 30 mm in which impurities were dispersed and in which the $SiO_2$ layer was locally removed so as to form an electrode.

The above-described photo-sensitive etchant was coated on the vacuum deposited aluminum film using a 4,000 rpm spinner, followed by maintaining it at 40° C for 15 minutes to form a dry, film-shaped photo-sensitive etchant layer of a thickness of 20 $\mu$ on the aluminum film. By conducting the image-exposure and the processing with an organic solvent in the same manner as described in Example 1, aluminum was completely removed from the areas where aluminum was not necessary as the electrode. Thus, an aluminum electrode was formed on the semi-conductor element. In this case, the exposure time was 50 seconds.

EXAMPLE 3

On a double-layered film (one being a gold film of a thickness of 1000 A and the other layer being an aluminum film of a thickness of 3000 A) provided, by vacuum deposition, on a Si—$SiO_2$ wafer of a diameter 30 mm in which impurities were dispersed and in which the $SiO_2$ layer was locally removed so as to form an electrode was coated a photo-sensitive composition using a 4,000 rpm spinner, this composition comprising 3 g of diphenylpinacol and 0.5 g of aniline hydrobromide as substances capable of producing water upon irradiation with light, 0.5 g of 85% perbenzoic acid as an etching reaction-accelerator, 0.5 g of xanthone as a photo reaction-accelerator, 1.5 g of polyvinyl pyrrolidone (molecular weight: about 20,000) as a binder and 3 g of acetone as a solvent. Then, the resulting assembly was maintained at 30° C for 15 minutes to form a 10 $\mu$-thick photosensitive layer on the metal film. Furthermore, a photo-sensitive agent comprising 5 g of phenylsulfapentafluoride as a fluorine compound, 1.5 g of polyvinyl pyrrolidone (molecular weight: about 20,000) as a binder, 3 g of acetone as a solvent and 1 g of xanthone as a photo-decomposition accelerator was applied thereto using a 3,000 rpm spinner, followed by maintaining it at 30° C for 15 minutes to form a dry, 20 $\mu$-thick, film-shaped photo-sensitive layer on the aforesaid photo-sensitive film. Thus, a photo-sensitive etchant layer comprising two layers: one layer being characterized as producing water upon irradiation with light; and the other layer being characterized as producing fluoride upon irradiation with light; was obtained on the metal film.

Then, it was exposed to a 100 W high pressure mercury lamp through a suitable image-bearing photomask intimately superposed thereon. Thus, the double-layered film comprising the gold film and the aluminum film located at the areas corresponding to the transparent portions was completely etched in a period as short as 50 seconds. Upon processing with an organic solvent, the excess of the two-layered photo-sensitive etchant and the reaction product between the photo-sensitive etchant and the double layered film comprising the gold layer and the aluminum layer were removed to form an electrode on the semi-conductor element.

EXAMPLE 4

A photo-sensitive etchant comprising 1 g of 1,2-dibromotetrafluorobenzene as a fluorine compound, 1 g of polyvinyl butyral (molecular weight of about 10,000) as a binder, 5 g of methanol as a solvent, 0.1 g of acetophenone as a photo-decomposition accelerator, and 0.8 g of diphenylpinacol and 0.2 g of aniline hydrobromide as substances capable of froming water upon irradiation with light was applied to an iron film vacuum-deposited in a thickness of about 1 $\mu$m on a polyester film (Mylar, trade name, Dupont Co.) according to a dip-coating method. Then, it was maintained at 30° C for 10 minutes to form a 40 μ-thick, dry, film-shaped photo-sensitive etchant layer on said iron film. Then, it was imagewise exposed to a 100 W high pressure mercury lamp through an image-bearing photomask intimately superposed thereon. Thus, the iron film located at the areas corresponding to the transparent image areas was completely etched in a period as short as 60 seconds to obtain an image of iron film on the polyester film in conformity with the photomask. The thus obtained image was highly contrasty wherein the light-transmitting areas and the light-non-transmitting areas were markedly different from each other.

EXAMPLE 5

On a chromium film of a thickness of about 1 μ vacuum-deposited on a Mylar film was coated a photo-sensitive layer comprising 1 g of ammonium persulfate as an etching reaction-accelerator, 1 g of polyvinyl alcohol (molecular weight: 20,000) as a binder, 5 g of acetone as a solvent, 0.1 g of nitroanthraquinone as a photo reaction-accelerator, and 0.8 g of pinacol and 0.2 g of aniline hydrobromide as substances capable of producing water upon irradiation with light, using a 4,000 rpm spinner. Then, it was maintained at a room temperature (about 20°–30° C) for 15 minutes to form a 20 μ-thick, dry, film-shaped photosensitive layer. Furthermore, a photo-sensitive layer comprising 3 g of 4,4'-fluorobenzophenone as a fluorine compound, 3 g of polyvinyl butyral (molecular weight of about 10,000) as a binder and 5 g of acetone as a solvent was similarly coated thereon to form a 20 μ-thick, dry layer on the above-described photo-sensitive layer. By conducting the image-exposure and the processing with an organic solvent in the same manner as described in Example 1, an image having hydrophilic areas comprising metal chromium portions-passive state chromium portions and hydrophobic areas was formed on the Mylar film. In this case, the exposure time was 70 seconds.

EXAMPLE 6

On a silicon film vacuum-deposited in a thickness of about 1 μ on a Mylar film was coated a photo-sensitive etchant comprising 4 g of perfluoronitrosomethane-tetrafluoroethylene copolymer (molar ratio: 1:1; molecular weight: about 10,000) as a fluorine compound which also functioned as a binder, 5 g of acetone as a solvent, 0.1 g of ω-bromoacetophenone as a photolysis-accelerator, 1 g of ammonium persulfate as an etching reaction-accelerator and 3 g of diphenylpinacol and 0.5 g of aniline hydrobromide as substances capable of producing water upon irradiation with light, according to a dip-coating method. Then, it was maintained at a room temperature for 20 minutes to form a 20 μ-thick, photo-sensitive etchant layer. By conducting the image-exposure and the processing with an organic solvent in the same manner as in Example 1, a scarlet image on the surface layer almost without etching the silicon film was obtained. In this case, the exposure time was 70 seconds.

EXAMPLE 7

On an aluminum film (thickness: 0.1 μ) provided on a transparent plastic film was coated a first composition comprising 4 g of polyvinyl butyral (molecular weight: about 10,000), 0.2 g of benzoin ethyl ether, 6 g of nitrosodimethylaniline, 4.7 g of benzyl cyanide and 5 g of acetone, followed by drying to form a 10 μ-thick layer capable of producing water upon irradiation with light. Furthermore, a second composition comprising 6 g of α,α,α-trifluorocresol, 3 g of polyvinyl butyral (molecular weight of about 10,000), 0.4 g of benzoin ethyl ether and 4 g of acetone was coated thereon and dried to form a 15 μ-thick layer capable of releasing an Al-etching photo-decomposition product upon exposure. Then, it was imagewise exposed for 40 seconds to a 100 W high pressure mercury lamp through an image-bearing photomask intimately superposed thereon. Thus, aluminum film located at the areas corresponding to the transparent image areas of the photomask was completely engraved. Upon processing it with a 1:1 by volume mixture of methanol and acetone, the excess photo-sensitive etchant and the reaction product between the photo-decomposition product thereof and aluminum were removed to obtain an image of aluminum in which extremely great differences in the optical density between the image areas and non-image areas existed.

EXAMPLE 8

On a double-layered film (one layer being a gold film of a thickness of 1000 A and the other layer being an aluminum film of a thickness of 3000 A) provided, by vacuum deposition, on a Si—SiO$_2$ wafer of a diameter of 30 mm in which inpurities were dispersed and in which SiO$_2$ layer was locally removed so as to form an electrode, was coated a first composition comprising 3 g of diphenylpinacol, 0.5 g of aniline hydrobromide, 0.5 g of 85% perbenzoic acid, 0.5 g of xanthone, 1.5 g of polyvinyl pyrrolidone (molecular weight: about 20,000) and 3 g of acetone, then dried to thereby form a 10 μ-thick layer capable of producing water upon irradiation with light. Furthermore, a second composition comprising 5 g of phenylsulfopentafluoride, 1.5 g of polyvinyl pyrrolidone (molecular weight: about 20,000), 3 g of acetone and 1 g of xanthone was coated thereon, then dried to form a layer comprising a substance capable of etching the metal film upon irradiation with light. Then, by conducting the exposure and the processing in the same manner as described in Example 1, an electrode comprising gold and aluminum on a semi-conductor element was formed. In this case, the exposure time was 50 seconds.

EXAMPLE 9

On an iron film vacuum-deposited in a thickness of about 0.1 μ on a transparent polyethylene film was coated a first composition comprising 0.8 g of diphenylpinacol, 0.2 g of aniline hydrobromide, 0.05 g of acetophenone, 0.5 g of polyvinyl butyral (molecular weight of about 10,000) and 3 g of methanol according to a dip-coating method. Then, it was maintained at 30° C for 10 minutes to form a film-shaped, dry layer of about 10 μ in thickness capable of producing water upon irradiation with light. Further, a second composition comprising 0.5 g of 1,2-dibromotetrabenzene, 0.05 g of acetophenone, 0.5 g of polyvinyl butyral (molecular weight of about 10,000) and 3 g of methanol was coated thereon and dried in the same manner as above to form a layer of a thickness of about 10 μ capable of producing an iron film-etching photo-decomposition product upon exposure to light. Then, it was imagewise exposed for 60 seconds to a 100 W high pressure mercury lamp through a suitable image-bering photomask intimately superposed thereon. The iron film located at the areas corresponding to the transparent image areas was completely etched. Thus, an image of iron film on the polyethylene film in conformity with the photomask was obtained.

The thus obtained image possessed transparent areas and non-transparent areas greatly different from each other, i.e., the image possessed high contrast.

EXAMPLE 10

On a 0.5–1 mm-thick aluminum plate was coated a first composition comprising 0.8 g of pinacol, 0.2 g of aniline hydrobromide, 0.05 g of nitroanthraquinone, 1 g of polyvinyl alcohol (molecular weight: 20,000) and 5 g of acetone, followed by drying. Furthermore, a second composition comprising 3 g of 4,4'-fluorobenzophenone, 3 g of polyvinyl butyral (molecular weight of about 10,000) and 5 g of acetone was coated thereon and dried. Thus, a photo-sensitive etchant stratum was formed which comprised a layer capable of producing water upon irradiation with light and a layer capable of producing aluminum-etching photo-decomposition product upon exposure to light. By conducting image-exposure and the after-treatment in the same manner as in Example 1, image of depressions on the aluminum plate was obtained. Thus, a name plate was produced. In this case, the exposure time was 70 seconds.

EXAMPLE 11

On a silicon film vacuum-deposited in a thickness of about 1 $\mu$ on a polyethylene film was coated a first composition comprising 3 g of polyvinyl alcohol, 3 g of nitrosodimethylaniline, 2.5 g of benzyl cyanide, 0.1 g of $\omega$-bromoacetophenone and 5 g of acetone, followed by drying. Then, a second composition comprising 2 g of polyvinyl alcohol (molecular weight about 20,000), 3 g of diphenyltrifluorophosphorane, 0.1 g of $\omega$-bromoacetophenone and 5 g of acetone was coated thereon and dried to form a two-layered photo-sensitive etchant. By conducting image-exposure and the after-treatment as in Example 1, a scarlet image was formed on the surface area almost without engraving the silicon film. In this case, the exposure time was 70 seconds.

EXAMPLE 12

The procedures described in Example 7 were conducted except that the first composition and the second composition were coated on a nickel plate in the reverse order.

EXAMPLE 13

A first composition comprising 3 g of nitrosodimethylaniline, 2.5 g of benzyl cyanide, 2.5 g of polystyrene and 3 g of benzene was mixed with a second composition comprising 3 g of fluorobenzophenone, 2.5 g of polystyrene (molecular weight about 20,000) and 2 g of benzene immediately before use, and coated on an aluminum plate, followed by drying to form a 30 $\mu$-thick photo-sensitive etchant layer. By conducting exposure and the after-treatment in the same manner as described in Example 1, an image of depressions was obtained on the aluminum plate in conformity with the photomask. Thus, a name plate was prepared. The exposure was conducted for 100 seconds.

EXAMPLE 14

A first composition comprising 4 g of aminophenyl-bis-(sulfapentafluoride) hydrobromide, 0.1 g of benzophenone, 3 g of polystyrene (molecular weight about 20,000) and 3 g of benzene was mixed with a second composition comprising 1 g of diphenylpinacol, 0.1 g of benzophenone, 3 g of polystyrene and 2 g of benzene immediately before use, and coated on a tellurium film provided on a plastic film, followed by drying. Thus, a 30 $\mu$-thick photo-sensitive etchant layer was formed. By conducting image-exposure and the after-treatment as described in Example 1, the same image on the tellurium film as that of photomask was obtained. The exposure time was 70 seconds.

While the invention has been described in detail and with reference to specific embodiments thereof, it will be apparent to one skilled in the art that various changes and modifications can be made therein without departing from the spirit and scope thereof.

What is claimed is:

1. A photo-sensitive etchant comprising a compound capable of producing, upon exposure to light, a metal film-etching substance or a substance which reacts with another substance to form a metal film-etching substance; a substance capable of producing water upon exposure to light; a binder; and a dryable coating solvent which does not detrimentally affect a metal film surface to which said photo-sensitive etchant is applied.

2. The photo-sensitive etchant as described in claim 1, wherein said substance capable of producing water upon exposure to light is selected from the group consisting of (a) N,N-dimethylnitroaniline and benzyl cyanide, (b) an alcohol and aniline hydrobromide, (c) nitromethane, and (d) methyl nitrite.

3. The photo-sensitive etchants described in claim 1, wherein said compound capable of producing a metal-etching substance or substance which reacts with an another substance to form a metal-etching product is selected from the group consisting of a compound containing an iminosulfadifluoride group, a compound containing a sulfapentafluoride group, a compound containing a sulfanyl fluoride group, a polyfluorinated benzene, a perfluorobiphenyl, a $\alpha,\alpha$, $\alpha$-trifluorotoluene, a trifluoromethylnaphthol, a fluorouracil, a co-polymer of a perfluoronitrosoalkane with tetrafluoroethylene, a compound containing a ketone group and a fluorine atom, a compound containing a difluoramino group, a compound converted from tetrafluorohydrazine, a perfluoro(alkylenealkylamine), a fluorinated hydrocarbon, a fluorinated alcohol, a fluorophosphorane, and a phosphoryl fluoride.

4. A method for forming metal images, which comprises coating a photosensitive etchant on a metal film, drying it and image-wise exposing said coated layer, said etchant comprising a compound capable of producing, upon exposure to light, a metal film-etching substance or a substance which reacts with another substance to form a metal film-etching substance; a substance capable of producing water upon exposure to light; a binder; and a dryable coating solvent which does not detrimentally affect said metal film.

5. A method for forming metal images, which comprises coating on a metal film a first composition and a second composition so that these two composition form integral layers and, after drying, image-wise exposing the thus formed layers, said first composition comprising a substance capable of producing water upon exposure to light, a binder and a dryable coating solvent which does not detrimentally affect said metal film, and said second composition comprising a compound capable of producing, upon exposure to light, a metal film-etching substance or a substance which reacts with another substance to form a metal film-etching substance, a binder and a dryable coating solvent which does not detrimentally affect said metal film.

6. The method as described in claim 4, wherein said substance capable of producing water upon exposure to light is selected from the group consisting of (a) N,N-dimethylnitroaniline and benzyl cyanide, (b) an alcohol and aniline hydrobromide, (c) nitromethane, and (d) methyl nitrite.

7. The method as described in claim 5, wherein said substance capable of producing water upon exposure to light selected from the group consisting of (a) N,N-dimethylnitroaniline and benzyl cyanide, (b) an alcohol and aniline hydrobromide, (c) nitromethane, and (d) methyl nitrite.

8. The method as described in claim 4, wherein said compound capable of producing a metal-etching substance or a substance which reacts with another substance to form metal-etching product is selected from the group consisting of a compound containing an iminosulfadifluoride group, a compound containing a sulfonyl fluoride group, a compound containing a sulfophenyl group, a polyfluorinated benzene, a perfluorobiphenyl, a $\alpha,\alpha,\alpha$-trifluorotoluene, a trifluoromethylnaphthol, a fluorouracil, a copolymer of a perfluoronitrosoalkane with $\alpha,\alpha,\alpha$-trifluorotoluene, a compound containing a ketone group and a fluorine atom, a compound containing a difluoramino group, a compound converted from tetrafluorohydrazine, a perfluoro(alkylenealkylamine), a fluorinated hydrocarbon, a fluorinated alcohol, a fluorophosphorane, and a phosphoryl fluoride.

9. The method as described in claim 5, wherein said compound capable of producing a metal-etching substance or a substance reacts with another substance is selected from the group consisting of a compound containing an iminosulfadifluoride group, a compound containing a sulfapentafluoride group, a compound containing a sulfophenyl fluoride group, a polyfluorinated benzene, a perfluorobiphenyl, a $\alpha,\alpha,\alpha$-triflurotoluene, a trifluoromethylnaphthol, a fluorouracil, a copolymer of a perfluoronitrosoalkane with tetrafluoroethylene, a compound containing a ketone group and a fluorine atom, a compound containing a difluoramino group, a compound converted from tetrafluorohydrazine, a perfluoro(alkylenealkylamine), a fluorinated hydrocarbon, a fluorinated alcohol, a fluorophosphorane, and a phosphoryl fluoride.

10. The photo-sensitive etchant of claim 1 wherein said another substance is said binder or a material comprising said binder.

11. The process of claim 4, wherein said another substance is said binder or a material comprising said binder.

12. The method of claim 5, wherein said another substance is said binder or a material comprising said binder.

13. The etchant of claim 10 wherein said solvent has a boiling point within the range of 35° C. to 90° C.

14. The method of claim 11 wherein said solvent has a boiling point within the range of 35° C to 90° C.

15. The method of claim 12 wherein said solvent has a boiling point within the range of 35° C to 90° C.

* * * * *